(12) United States Patent
Shklover et al.

(10) Patent No.: US 11,982,788 B2
(45) Date of Patent: May 14, 2024

(54) METHOD FOR FORMING NANOSTRUCTURES ON A SURFACE AND OPTICAL ELEMENT

(71) Applicant: Carl Zeiss SMT GmbH, Oberkochen (DE)

(72) Inventors: Vitaliy Shklover, Heidenheim (DE); Alexandra Pazidis, Essingen-Lautenburg (DE)

(73) Assignee: CARL ZEISS SMT GMBH, Oberkochen (DE)

( * ) Notice: Subject to any disclaimer, the term of this patent is extended or adjusted under 35 U.S.C. 154(b) by 435 days.

(21) Appl. No.: 17/341,239

(22) Filed: Jun. 7, 2021

(65) Prior Publication Data

US 2021/0293996 A1      Sep. 23, 2021

Related U.S. Application Data

(63) Continuation of application No. PCT/EP2019/083628, filed on Dec. 4, 2019.

(30) Foreign Application Priority Data

Dec. 7, 2018   (DE) ..................... 10 2018 221 189.2

(51) Int. Cl.
    *G02B 1/12*      (2006.01)
    *B82Y 20/00*    (2011.01)
    (Continued)

(52) U.S. Cl.
    CPC ................ *G02B 1/12* (2013.01); *C23C 14/24* (2013.01); *C23C 16/0245* (2013.01);
    (Continued)

(58) Field of Classification Search
    CPC ...................................................... G02B 1/12
    See application file for complete search history.

(56) References Cited

U.S. PATENT DOCUMENTS

| 5,963,365 A | 10/1999 | Shirai |
| 6,359,735 B1 | 3/2002 | Gombert et al. |

(Continued)

FOREIGN PATENT DOCUMENTS

| DE | 10350114 A1 | 1/2006 |
| DE | 102006004835 A1 | 8/2006 |

(Continued)

OTHER PUBLICATIONS

Azumi et al., "Laser damage of Calcium Fluoride by ArF excimer laser irradiation," 2015, Proc of SPIE 9632, p. 963213. (Year: 2015).*

(Continued)

*Primary Examiner* — Robert A Vetere
(74) *Attorney, Agent, or Firm* — Edell, Shapiro & Finnan, LLC

(57) ABSTRACT

A method for forming in particular reflection-reducing nanostructures (5) on a preferably polished surface (3) of a crystalline, in particular ionic, substrate (1) for transmission of radiation in the FUV/VUV wavelength range. The method includes: providing a surface (3, 7), which surface is not oriented along a lattice plane having a minimum surface energy, on the substrate (1) or on a layer (6) applied to the substrate (1) by a coating method, in particular vacuum vapor deposition, and introducing an energy input (E) into the surface (7) for rearranging the surface (7) to form the nanostructures (5), wherein the energy input (E) is generated by irradiating the surface (7) with electromagnetic radiation (4). Also, an optical element for transmission of radiation in the FUV/VUV wavelength range.

17 Claims, 2 Drawing Sheets

(51) Int. Cl.
  *B82Y 30/00*   (2011.01)
  *B82Y 40/00*   (2011.01)
  *C23C 14/24*   (2006.01)
  *C23C 16/02*   (2006.01)
  *G02B 1/113*   (2015.01)
  *G02B 1/118*   (2015.01)

(52) U.S. Cl.
  CPC .............. *G02B 1/113* (2013.01); *G02B 1/118*
    (2013.01); *B82Y 20/00* (2013.01); *B82Y 30/00*
    (2013.01); *B82Y 40/00* (2013.01)

(56) References Cited

U.S. PATENT DOCUMENTS

| | | | |
|---|---|---|---|
| 6,466,365 B1 | 10/2002 | Maier et al. | |
| 6,476,968 B1 | 11/2002 | Kato et al. | |
| 6,833,949 B2 | 12/2004 | Maier et al. | |
| 6,872,479 B2 | 3/2005 | Maier et al. | |
| 7,128,984 B2 | 10/2006 | Maier et al. | |
| 7,268,948 B2 | 9/2007 | Matsuo et al. | |
| 7,327,769 B2 | 2/2008 | Henschke et al. | |
| 7,903,699 B2 | 3/2011 | Seguin et al. | |
| 8,399,110 B2 | 3/2013 | Cangemi et al. | |
| 9,530,636 B2 | 12/2016 | Oh et al. | |
| 9,933,711 B2 | 4/2018 | Shklover et al. | |
| 2003/0021015 A1 | 1/2003 | Maier et al. | |
| 2004/0006249 A1 | 1/2004 | Hoshino et al. | |
| 2004/0202225 A1 | 10/2004 | Maier et al. | |
| 2005/0023131 A1 | 2/2005 | Takaki | |
| 2006/0024018 A1 | 2/2006 | Piehl et al. | |
| 2006/0046099 A1 | 3/2006 | Maier et al. | |
| 2006/0171438 A1 | 8/2006 | Maier | |
| 2006/0213880 A1* | 9/2006 | Tanaka ................... | G02B 1/118 219/121.69 |
| 2007/0091288 A1* | 4/2007 | Lin ........................ | G02B 1/113 355/30 |

FOREIGN PATENT DOCUMENTS

| | | |
|---|---|---|
| DE | 102005040324 A1 | 10/2006 |
| DE | 102008002193 A1 | 3/2009 |
| EP | 1707994 A1 | 10/2006 |
| EP | 1614199 B1 | 1/2008 |
| EP | 1384293 B1 | 12/2009 |
| EP | 2177934 B1 | 9/2011 |
| EP | 2372404 B1 | 1/2013 |
| JP | 11140617 | 5/1999 |
| JP | 11140617 A | 5/1999 |
| JP | 11172421 | 6/1999 |
| JP | 2003193231 A | 7/2003 |
| JP | 2004347860 A | 12/2004 |
| KR | 1020060104938 A | 10/2006 |
| KR | 1020120129007 A | 11/2012 |
| WO | 2009017634 A2 | 2/2009 |

OTHER PUBLICATIONS

International Preliminary Report on Patentability and the Written Opinion, PCT/EP2019/083628, Jun. 8, 2021, 10 pages.
German Office Action with English translation, Application No. 10218221189.2, Aug. 8, 2019, 8 pages.
Sobolev et al. "Phase Diagrams of the CaF2—(Y, Ln) F3 Systems", Journal of the Less-Common Metals, 60 (1978) pp. 22-46.
Lithotec Calcium Fluoride Micro-lithography technologies, Hellma Materials (2017), 8 pages.
German Office Action, Application No. 102018221189.2, Aug. 8, 2019, 4 pages.
Dabringhaus et al., "Studies of the Facetting of the Polished (100) Face of CaF2", 2003 American Institute of Physics, 8 pages.
Prieto et al., "Stranski-Krastanovc mechanism of growth and the effect of misfit sign on quantum dots nucleation", Typeset by REVTex, Jun. 2017, 18 pages.
Azumi et al., "Laser damage of Calcium Fluoride by ArF excimer laser irradiation", SPIE vol. 9632, 2015, 7 pages.
Eglitis et al., "First-Principles Calculations of the CaF2(111), (110), and (100) Surface Electronic and Band Structure", Surface Reciew and Letters, vol. 13, Nos. 2&3 (2006) pp. 149-154.
Chattopadhyay, et al., "Anti-reflecting and photonic nanostructures", Materials Science and Engineering R, (2010) pp. 1-35.
Rix et al., "Formation of metallic colloids in CaF2 by intense ultraviolet light", Applied Physics Letter 99, (2011), 4 pages.
Wilson et al., "The Optical Properties of 'Moth Eye' Antireflection Surfaces", Optica Acta: International Journal of Optics, 1985, vol. 29, No. 7 pp. 993-1009.
Lohmueller et al., "Biomimetric Interfaces for High-Performance Optics in the Deep-UV LIght Range", American Chemistry Society, (2008), 6 pages.
Natura et al., "Study of haze in 193 nm high dose irradiated CaF2 crystals", Proc. of SPIE vol. 7504 (2009), 8 pages.
Southwell, "Pyramid-array-surface-relief structures producing antireflection index matching on optical surfaces", vol. 8, No. 3, Mar. 1991, J. Opt. Soc. Am.A., pp. 549-553.
International Search Report, PCT/EP2019/083628, Feb. 26, 2020, 3 pages.
Azumi et al., "Laser damage of Calcium Fluoride by ArF excimer laser irradiation", Proc of SPIE vol. 9632 (2015), 7 pages.
Korean Office Action with English translation, Application No. 10-2021-7020407, Dec. 14, 2023, 10 pages.

* cited by examiner

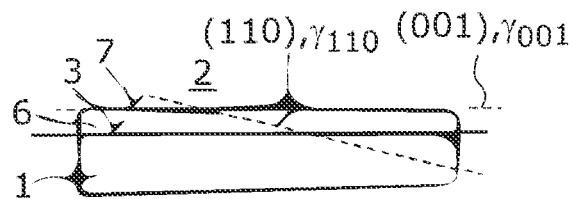
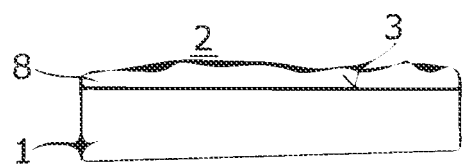
Fig. 3A
Fig. 4A
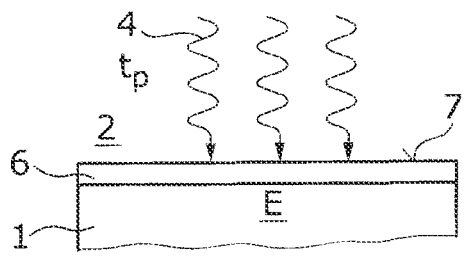
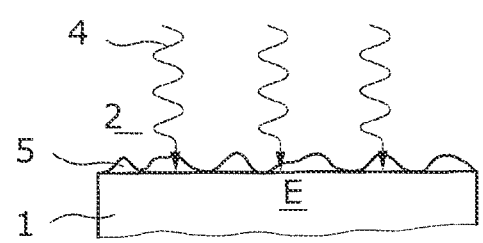
Fig. 3B
Fig. 4B
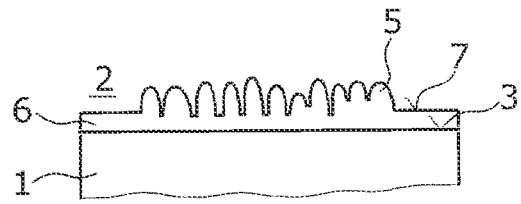
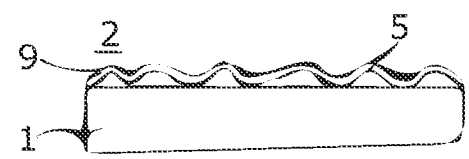
Fig. 3C
Fig. 4C
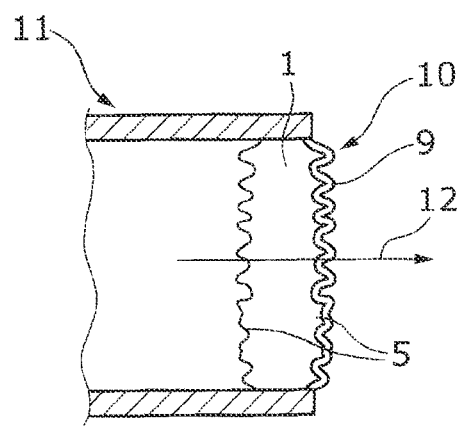
Fig. 5

METHOD FOR FORMING NANOSTRUCTURES ON A SURFACE AND OPTICAL ELEMENT

CROSS-REFERENCE TO RELATED APPLICATION

This is a Continuation of International Application PCT/EP2019/083628, which has an international filing date of Dec. 4, 2019, and the disclosure of which is incorporated in its entirety into the present Continuation by reference. This Continuation also claims foreign priority under 35 U.S.C. § 119(a)-(d) to and also incorporates by reference, in its entirety, German Patent Application DE 10 2018 221 189.2 filed on Dec. 7, 2018.

FIELD OF THE INVENTION

The invention relates to methods for forming in particular reflection-reducing nanostructures on a preferably polished surface of a (mono-)crystalline, in particular ionic, substrate for transmission of radiation in the FUV/VUV wavelength range. The invention also relates to an optical element for transmission of radiation in the FUV/VUV wavelength range which has a (mono-)crystalline, in particular ionic, substrate.

BACKGROUND

For highly loaded optical elements in the Far-Ultraviolet (FUV)/vacuum ultraviolet (VUV) wavelength range at wavelengths of between approximately 100 nm and approximately 280 nm, primarily for microlithography, fluorides are generally used as substrate material, in particular calcium fluoride ($CaF_2$) and magnesium fluoride ($MgF_2$). Under irradiation with high intensities, first instances of damage occur on the surface of the $CaF_2$ material as early as after approximately $10^6$ pulses, cf. [1, 2]. As a result of the interaction with the FUV/VUV radiation, local fluorine depletion occurs in the volume of the optical elements, resulting in the formation of Ca metal colloids, which themselves serve as nuclei for massive degradation. Fluorine depletion occurs even more rapidly at the surface, and in the process the fluorine atoms liberated can escape into the environment.

By way of example, degradation in the form of a white, powdery deposit was observed on the outer side of a laser or discharge chamber window of an excimer laser, said window consisting of $CaF_2$, with a laser energy density of more than 20 mJ/cm². By contrast, no damage occurred on the inner side of the discharge chamber window, which was in contact with the fluorine-containing laser gas, which allows conclusions to be drawn about fluorine as the decisive substance in order to prevent the occurrence of the powdery deposit or the degradation.

It has been found that the surface preparation or cleaning and subsequent sealing of the cleaned surface are of importance in order to increase the radiation resistance of optical elements. Numerous solutions for improving the radiation resistance have been proposed:

Ultrasonic cleaning or etching with subsequent UV and plasma cleaning (WO2009017634A2, DE102005040324A1 or the parallel US712898462), sealing by high-density metal fluoride layers which in a fluorine-containing atmosphere are sputtered (US20050023131A1, JP2003193231A1), reactively deposited (JPH11172421A1) or subjected to after-treatment (US20040006249A1, JPH 11140617A1, JP2004347860A1), sealing of optical elements (for example of the outer side of a laser chamber window) with oxides $Al_2O_3$ and $SiO_2$ or fluorinated $SiO_2$ (DE10350114B4, DE102006004835A1, EP1614199B1, US20030021015A1, US20040202225A1, U.S. Pat. No. 6,466,365B1, U.S. Pat. No. 6,833,949B2, U.S. Pat. No. 6,872,479B2) or improvement of the adhesion of sealing oxide layers by a fluoridic adhesion promoter layer (U.S. Pat. No. 8,399,110 B2).

However, all these solutions substantially only influence the radiation resistance, without reducing transmission losses as a result of Fresnel reflections at interfaces. In order to reduce transmission losses as a result of reflection at the surfaces, optical elements are typically subjected to antireflective coating. The antireflective coating is effected, in principle, either by applying interference layers or by nanostructuring.

The proposed solutions for antireflection layers which are more resistant to radiation (for example U.S. Pat. No. 5,963,365A1, US993371162), offer a compromise between the antireflection effect (e.g. broadband characteristic, angle of incidence acceptance) and the radiation resistance. Nanostructuring provides the advantage of achieving broadband antireflective coatings having a comparatively small thickness.

The idea of using nanostructured surfaces according to the moth eye principle as reflective coating was already conceived of decades ago [3, 4]. Many applications have been proposed for such subwavelength structures, for example in microlithography (EP2177934B1, EP2372404B1) or in a laser-assisted plasma light source (U.S. Pat. No. 9,530,636B2), and numerous production methods have been described (inter alia in [5], U.S. Pat. No. 6,359,735B1, US2006024018A1, U.S. Pat. No. 7,268,948B2), inter alia also for the DUV-VUV wavelength range [6] and in particular for optical elements composed of fluoridic crystals (U.S. Pat. No. 6,476,968B1).

However, excessively high absorption and an anisotropic etching behavior are obstacles to a practical use of lithographically produced nanostructured antireflective coatings on fluoridic substrates in the FUV/VUV spectral range.

SUMMARY

It is an object of the invention to provide methods for forming nanostructures on a surface in which the absorption of the surface is as far as possible not increased, and an optical element having such a surface.

This object is achieved in accordance with a first aspect with a method of the type mentioned in the introduction, comprising: providing a surface, which is not oriented along a lattice plane with a minimal surface energy, on the substrate or on a layer applied to the substrate by a coating method, for example a vacuum vapor deposition method, and introducing an energy input into the surface for rearranging the surface to form the nanostructures.

This aspect of the invention exploits the fact that surfaces of (mono-)crystalline substrates or layers, in particular of ionic (mono-)crystalline substrates, or materials, in which the net or lattice planes have a dipole character, depending on the exposed lattice plane, have great differences in their surface energy. In the method for forming the nanostructures, the exposed surface of the substrate does not run along a lattice plane of the crystal having a minimum surface energy, but rather typically along one or more other plane(s), or has a geometry deviating from a plane, such that the surface energy of the exposed surface is greater than the minimum surface energy.

If energy of a magnitude sufficient to overcome an activation energy required for rearranging the exposed surface is input into such an (exposed) surface, the exposed surface adopts a different configuration with a lower surface energy. The rearrangement of atoms or of groups of atoms (of groups corresponding to the chemical molecule of an ionic compound of the crystal, e.g. $CaF_2$) into the energetically more favorable state results in a faceting and thus in a nanostructuring of the exposed surface.

For the rearrangement it is not necessary for the entire exposed surface to undergo transition to a configuration with a lower surface energy, rather the reduction of that portion of the exposed surface which has an energetically unfavorable state and a simultaneous increase of that proportion of the exposed surface which has an energetically more favorable state are already sufficient for the formation of the nanostructures.

Experimental studies have observed the faceting of polished $CaF_2$ (100) in ultrahigh vacuum (UHV) during heat treatment or during homoepitaxial growth in the temperature range between 874-1093 K (cf. [7]). It is known [8] that in the case of $CaF_2$ the (111) surface has the lowest surface energy (0.438 $J/m^2$) in comparison with the (110) surface (0.719 $J/m^2$) and the (100) surface (0.979 $J/m^2$). As a result, an energy input that results in the rearrangement or reordering of atoms in the single crystal until energetically more favorable (111) facets have formed, causes the nanostructures described further above to form in the process.

The lattice plane having a minimum surface energy is dependent on the material of the substrate or of the ionic crystal. For the case where the substrate or the ionic crystal is not formed from $CaF_2$, but rather from $MgF_2$, for example the (110) lattice plane, rather than the (111) lattice plane, has a minimum surface energy, i.e. the exposed surface should not run along the (110) lattice plane. In the present application, the lattice planes are described by the Miller indices in the generally customary way.

The energy input can be introduced into the substrate in principle by conduction and/or by convection. A direct heat transfer (conduction) through a contact of the surface or of the substrate with a warmed-up or heated solid that is at a sufficiently high temperature for the transmission of heat, or through convection, e.g. via a fluid at a sufficient temperature flowing past the surface, can produce an energy input into the exposed surface which causes a rearrangement of the surface. In practice, however, it is difficult or impossible for a surface of an optical system that has already been polished to completion to be heated up to approximately 1000 K and to be heat-treated in order to achieve the nanostructuring of the surface, since in that case the surface shape would change and deviate from the target surface shape to an excessively great extent.

In one variant, the energy input is generated by irradiating the exposed surface with electromagnetic radiation, i.e. the electromagnetic radiation provides the (thermal) energy for the rearrangement. It has been found that irradiating the exposed surface with radiation having a sufficiently high intensity (~$10^{-2}$-$10^{-1}$ $W/cm^2$) is sufficient to overcome the activation energy and to cause a rearrangement of the exposed surface. In order to avoid an alteration of the geometry of the surface, it is advantageous to heat up only that region of the optical element which is near the surface, which can be achieved by the irradiation, particularly if the irradiation is effected in a wavelength range in which the material of the substrate or of the epitaxially grown layer greatly absorbs the radiation, such that the penetration depth into the substrate is small.

It has proved to be advantageous if the surface is irradiated with the electromagnetic radiation in a pulsed manner since, in this case, the energy introduced is used as fully as possible for the conversion of the surface and not for the heating of the substrate.

In one variant, the surface is irradiated with pulsed electromagnetic radiation having pulse durations of less than 300 ns. The use of radiation having short pulse durations of the order of magnitude of nanoseconds makes it possible to effectively prevent the propagation of heat in the volume of the crystalline substrate, and so a large portion of the heat is fed to the surface. For generating pulses having pulse durations of the order of magnitude indicated above, laser light sources in the short-pulse mode are generally used, but it is also possible, in principle, to use other light sources, e.g. laser-excited plasma light sources, for generating radiation having short pulse durations.

Preferably, the surface is irradiated with electromagnetic radiation in the FUV/VUV wavelength range or in the IR wavelength range. As has been described further above, the surface should be irradiated with electromagnetic radiation in a wavelength range in which the material of the substrate or of the layer has comparatively high absorption. This is the case for many fluoridic substrates at wavelengths in the FUV/VUV wavelength range of less than approximately 200 nm or in the infrared (IR) wavelength range at wavelengths of more than approximately 10000 nm.

The greater the absorption in the respective wavelength range, the smaller typically the penetration depth into the substrate, such that the energy introduced remains concentrated on the surface or on a volume near the surface. In the case of $CaF_2$ as material, it is evident from the transmission spectrum (cf. for example the data sheet "http://www.hellma-materials.com/text/986/en/ausblenden/hellma-materials-calcium-fluoride.html") that the use of radiation at wavelengths of less than 100 nm or more than 14 μm is particularly advantageous because $CaF_2$ has only extremely low transmission in these wavelength ranges.

In one variant, the surface is irradiated with electromagnetic radiation at wavelengths of less than 200 nm. In the short-wave range, it is possible to use excimer lasers having a wavelength of 193 nm (ArF) or 157 nm ($F_2$) in the short-pulse mode or laser-excited plasma light sources, wherein in all these light sources the risk of degradation is very high on account of two-photon processes.

In a further variant, the surface is irradiated with electromagnetic radiation at wavelengths of more than 9 μm. In the long-wave wavelength range, Q-switched $CO_2$ short-pulse lasers (cf. for example EP1384293B1, U.S. Pat. No. 7,327,769 B2, U.S. Pat. No. 7,903,699B2) have proved to be advantageous. Such lasers firstly have a sufficient power or intensity and secondly supply short laser pulses having pulse durations of less than 100 ns, which effectively prevents the propagation of heat in the crystal volume. The laser wavelength of $CO_2$ lasers is in the wavelength range of 9 μm to 11 μm.

Preferably, for providing the exposed surface, the substrate is cut along a lattice plane which does not correspond to the lattice plane having a minimum surface energy. As has been described further above, great differences in the surface energies arise particularly in the case of ionic crystals depending on the exposed lattice plane. The orientation of the lattice plane along which the crystal is cut is generally chosen such that said lattice plane has the highest possible surface energy. If $CaF_2$ is chosen as substrate material, as described further above, the exposed surface can run along the (100) lattice plane, for example, since the latter has a comparatively high surface energy. The lattice plane along which the exposed surface should be cut is dependent on the material of the substrate or on the layer grown epitaxially onto the substrate.

In a further variant, introducing the energy input is carried out until the surface on which the nanostructures are formed has a reflectivity for radiation in the FUV/VUV wavelength range that is reduced by at least 0.03 by comparison with the surface prior to introducing the energy input, and/or has a reflectivity of less than 0.02 for radiation in the FUV/VUV wavelength range. As has been described further above, the rearrangement rate is dependent on a number of process parameters. Given a sufficiently long time duration of the energy input, however, the reflectivity of the surface can generally be significantly decreased.

The reflectivity for radiation in the FUV/VUV wavelength range is understood to mean that the reflectivity in the entire wavelength range between 100 nm and 280 nm is reduced by the value (0.03) indicated above or is decreased below the value (0.02) indicated above. For the case where consideration is given to a smaller wavelength range comprising for example only the VUV wavelength range between approximately 100 nm and approximately 200 nm, the reflectivity can possibly be decreased to an even significantly greater extent, for example by more than approximately 0.04 to 0.05, and the absolute reflectivity of the surface on which the nanostructures are formed can also be decreased to less than e.g. 0.01.

In one variant, the substrate and/or the layer applied by a coating method, for example vacuum vapor deposition, are/is formed form a fluoridic crystal, preferably selected from the group comprising: $LiF$, $CaF_2$, $MgF_2$, $BaF_2$, $SrF_2$, $LaF_3$, $YF_3$. Besides $CaF_2$ described further above, the method described here is also suitable for forming nanostructures on other fluoridic single crystals, for example on the single crystals enumerated further above. $CaF_2$ and $MgF_2$ in particular, have high transmission in the FUV/VUV wavelength range and are therefore suitable for example as discharge chamber windows for excimer lasers.

In the method described above, the respective layer can be applied by homoepitaxial growth, i.e. the substrate and the growing layer are formed from the same material. In this case, typically both the surface of the applied layer and the surface of the substrate are oriented identically with regard to their crystal structure, and in particular are not oriented along a lattice plane having a minimum surface energy. Alternatively, the layer can be applied to the substrate by heteroepitaxial growth. In this case, a monocrystalline fluoridic layer composed, for example, of the materials mentioned above or a fluoride mixed system, i.e. a mixed crystal or a solid solution composed of at least two fluorides, for example composed of $Ca_xMg_{1-x}F_2$ or composed of $Ca_{1-x}La_xF_{2+x}$, can be applied on the surface of a substrate composed of a different material, in particular on the surface of a different fluoridic single crystal, e.g. $CaF_2$. In this case, introducing the energy input by irradiating the surface with radiation in the IR wavelength range has proved to be particularly advantageous.

In accordance with a further aspect of the invention, the object is achieved by a method of the type mentioned in the introduction, comprising: forming the nanostructures by three-dimensional island formation (Stranski-Krastanov growth mode) on a fluoridic mixed crystal produced by a coating method, for example vacuum vapor deposition, on the surface of the substrate formed from a metal fluoride, in particular from $CaF_2$.

This aspect of the invention is based on the insight (cf. [9]) that the lattice mismatch during heteroepitaxial growth can result in three-dimensional island growth (Stranski-Krastanov growth mode). It is furthermore known (cf. [10]) that in the system $CaF_2$-$LnF_3$ (Ln denotes an element of the lanthanum group, i.e. La, Ce, Pr, Nd, Pm, Sm, Eu, Gd, Tb, Dy, Ho, Er, Tm, Yb, Lu) very wide concentration ranges exist in which mixed crystals (solid solutions) having a fluorite crystal structure ($Ca_{1-x}Ln_xF_{2+x}$) exist. In FIG. 2 of [10], the lattice constant as a parameter of the unit cell is indicated as a function of the concentration (in mol-%) of $LnF_3$. It can be gathered from the illustration in FIG. 2 that even relatively low concentrations of the second component, i.e. of $LnF_3$, can produce a sufficient lattice mismatch to enable 3D island growth by way of the so-called Volmer-Weber growth process, as is described in [9].

By suitably choosing process parameters during the growth or formation of the mixed crystal made from $CaF_2$ and $LnF_3$, it is possible to adapt the size and density of the nanostructures produced in order to achieve the best possible antireflection effect. In this case, too, it is possible to use the introduction of an energy input into the surface during the growth or during the formation of the mixed crystal in order to support the desired structure formation. In particular, it is possible to carry out an irradiation of the surface of the substrate on which the metal fluoride grows with electromagnetic radiation, especially with preferably pulsed radiation in the IR wavelength range.

In a further advantageous variant, the method comprises: applying at least one in particular conformal, preferably fluoridic or oxidic, protective layer to the nanostructures. The protective layer serves to seal the nanostructures or the surface in order in this way to improve the radiation resistance of the nanostructures or of the nanostructured surface. The protective layer can contain in particular a metal fluoride which is deposited by sputtering in a fluorine-containing atmosphere or reactively deposited or is subjected to an aftertreatment, as described in the documents cited in the introduction, US20050023131A1, JP2003193231A1, JPH 11172421A1 or respectively US20040006249A1, JPH 11140617A1, JP2004347860A1, which are incorporated by reference in their entirety in the content of this application. Sealing with an oxidic protective layer, for example with $Al_2O_3$, $SiO_2$ or fluorinated $SiO_2$, is also possible.

Preferably, the protective layer is applied by atomic layer deposition (ALD) in order to enable the nanostructures to be covered as conformally as possible. The ALD process constitutes a self-limiting process that makes it possible to apply the protective layer to the nanostructures ply by ply and thus homogeneously. In this way, the surface geometry provided with the nanostructures is maintained even after the protective layer has been applied.

The invention also relates to an optical element of the type mentioned in the introduction in which the surface of the substrate or a layer applied to the substrate by epitaxial growth has nanostructures which are formed or have been formed in accordance with the method described further above. In the simplest case, the transmissive optical element can consist of the substrate described further above. In this case, the substrate already has the geometry provided for the optical element; the surface on which the nanostructures have been formed is a polished surface. Optionally, however, the substrate can also be reworked in order to produce the optical element, for example by marginal trimming of the substrate in order to introduce the latter into a mount. The surface of the substrate or of the optical element which has the nanostructures can be a plane surface or optionally a curved surface. The material of the substrate and/or of the layer can be for example $CaF_2$, $MgF_2$ or some other fluoridic crystal.

In one embodiment, the surface having the nanostructures has a reflectivity of less than 0.02, preferably of less than 0.01, for radiation in the FUV/VUV wavelength range. As has been described further above, it is possible to produce a correspondingly low reflectivity at the surface if the process parameters are chosen suitably or if the time duration for introducing the energy input is sufficiently long.

In a further embodiment, the optical element is embodied as a discharge chamber window for an excimer laser. In this case, the optical element is generally embodied as a plane-parallel plate. Typically, in this case at least one (plane) side of the optical element has the nanostructures described further above. In the state where the output coupling element is installed in the excimer laser, said side is at least the inner side of the optical element facing the chamber. Transmissive optical elements other than the output coupling window described here can also be provided with nanostructures in order to produce an antireflective effect on them.

Further features and advantages of the invention are evident from the following description of exemplary embodiments of the invention, with reference to the figures of the drawing, which show details essential to the invention, and from the claims. The individual features can each be realized individually by themselves or as a plurality in any desired combination in a variant of the invention.

BRIEF DESCRIPTION OF THE DRAWINGS

Exemplary embodiments are illustrated in the schematic drawing and are explained in the following description. In the figures:

FIGS. 3A-C show schematic illustrations of several steps of a method for forming nanostructures on a layer composed of $MgF_2$, FIGS. 4A-C show schematic illustrations of several steps of a method for forming nanostructures in the form of three-dimensional islands on a mixed crystal on a surface of a substrate composed of $CaF_2$, and FIG. 5 shows a schematic illustration of an optical element in the form of a discharge chamber window of an excimer laser.

DETAILED DESCRIPTION

In the following description of the drawings, identical reference signs are used for identical or functionally identical component parts.

Figure 1A:
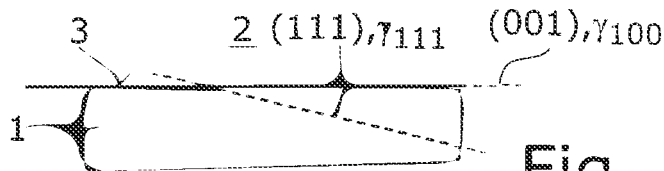
FIGS. 1A-C show schematic illustrations of several steps of a method for forming nanostructures on a surface of a substrate composed of $CaF_2$.

FIG. 1A shows a (mono-)crystalline substrate 1 having a plane surface 3 that is exposed vis à vis an environment 2. In the example shown, the substrate 2 is $CaF_2$ forming an ionic crystal. $CaF_2$ is suitable for the transmission of radiation at wavelengths in the FUV/VUV wavelength range, i.e. it has a comparatively low absorption for radiation in this wavelength range, and so this material can be used as a substrate for a transmissive optical element. Instead of $CaF_2$, it is also possible to use a different material having a sufficient transmission for radiation at wavelengths in the FUV/VUV wavelength range, for example $MgF_2$. Other fluoridic crystals, for example $BaF_2$, $SrF_2$, $LaF_3$, $YF_3$, LiF can also be used as substrate materials.

The exposed surface 3 shown in FIG. 1A is a (100) lattice plane of the lattice structure of the substrate 1, said lattice structure not being illustrated pictorially. In order to expose the surface 3, the substrate 1 was cut along the (100) lattice plane. However, exposing the surface 3 of the substrate 1 along the (100) lattice plane can also be effected by a different form of (mechanical) processing. The (100) lattice plane has a surface energy $\gamma_{100}$ of approximately 0.979 $J/m^2$, which is greater than the surface energy $\gamma_{111}$ of approximately 0.438 $J/m^2$ of a (111) lattice plane, which has the minimum surface energy of all the lattice planes of the substrate 1. The (110) lattice plane has for example a surface energy $\gamma_{110}$ of 0.719 $J/m^2$, i.e. $\gamma_{100} > \gamma_{110} > \gamma_{111}$ holds true. The exposed surface 3 of the substrate 1 as illustrated in FIG. 1A has in the FUV/VUV wavelength range between 100 nm and 280 nm a reflectivity R—illustrated in a dashed manner in FIG. 2—as a function of the wavelength λ that is more than 0.035 over the entire FUV/VUV wavelength range, i.e. more than 3.5% of the radiation impinging on the exposed surface 3 is reflected at the latter.

In order to reduce the reflectivity R of the exposed surface 3, an energy input E is introduced into the exposed surface 3. In the example shown in FIG. 1B, for this purpose the exposed surface 3 is irradiated with electromagnetic radiation 4, the latter being radiation 4 in the FUV/VUV wavelength range. The intensity of the radiation 4 is chosen with a magnitude such that an activation energy for the rearrangement of atoms or of groups of atoms of the exposed surface 3 is exceeded, such that the exposed surface 3 changes its configuration and nanostructures 5 form on the latter, i.e. the exposed surface 3 is roughened, as is illustrated (on an exaggerated scale) in FIG. 1C. The rearrangement is fostered by the surface energy $\gamma_{100}$ of the exposed surface 3 being significantly greater than the minimum surface energy $\gamma_{111}$ along the (111) lattice plane.

Figure 1B:
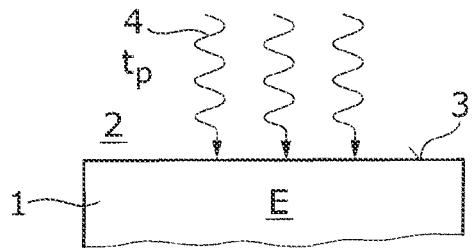
Figure 1C:
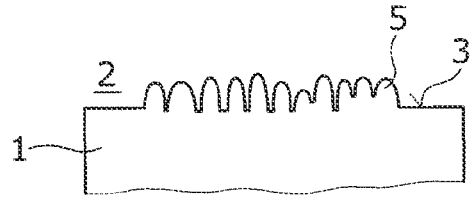

In the example shown in FIGS. 1A-C, the irradiated surface 3 is a polished surface, the plane basic geometry of which in the example shown should as far as possible not change when the energy input E is introduced. Since maintaining the geometry of the surface 3 may not necessarily be ensured in the event of heat being input into the volume of the substrate 1, it is advantageous if the energy input E is limited as far as possible to a region near the surface.

In order that the substrate 1 is heated as far as possible only in the region of the surface 3, but not in the volume, use is made of FUV/VUV radiation in a wavelength range in which the $CaF_2$ substrate has the greatest possible absorption. This is the case for irradiation with wavelengths of less than 200 nm, ideally of less than 100 nm. In order to generate such radiation 4, use can be made of an ArF excimer laser, for example, which emits at a wavelength of approximately 193 nm. Excimer lasers at other wavelengths, for example an $F_2$ excimer laser, which emits at a wavelength of approximately 157 nm, can also be used for this purpose. Laser-excited plasma light sources that emit radiation e.g. in the extreme ultraviolet (EUV) wavelength range at wavelengths of approximately 10-100 nm can also optionally be used for this purpose. During irradiation with short-wave radiation at wavelengths of less than approximately 200 nm, there is the risk, however, of the $CaF_2$ substrate being damaged by two-photon processes.

In addition to irradiation of the surface 3 at a wavelength at which the absorption of the irradiated substrate material is particularly high, the penetration depth of the radiation 4 can be reduced by the irradiation being effected in a pulsed manner. In particular, the penetration depth of the radiation 4 can be reduced if the pulse durations $t_P$ of the individual (laser) pulses are comparatively short and are e.g. less than 300 ns, preferably less than 100 ns. Such short pulse durations $t_P$ can be achieved if the corresponding (laser) light sources are operated in the short-pulse mode, for example using Q-switching or the like.

Figure 2:
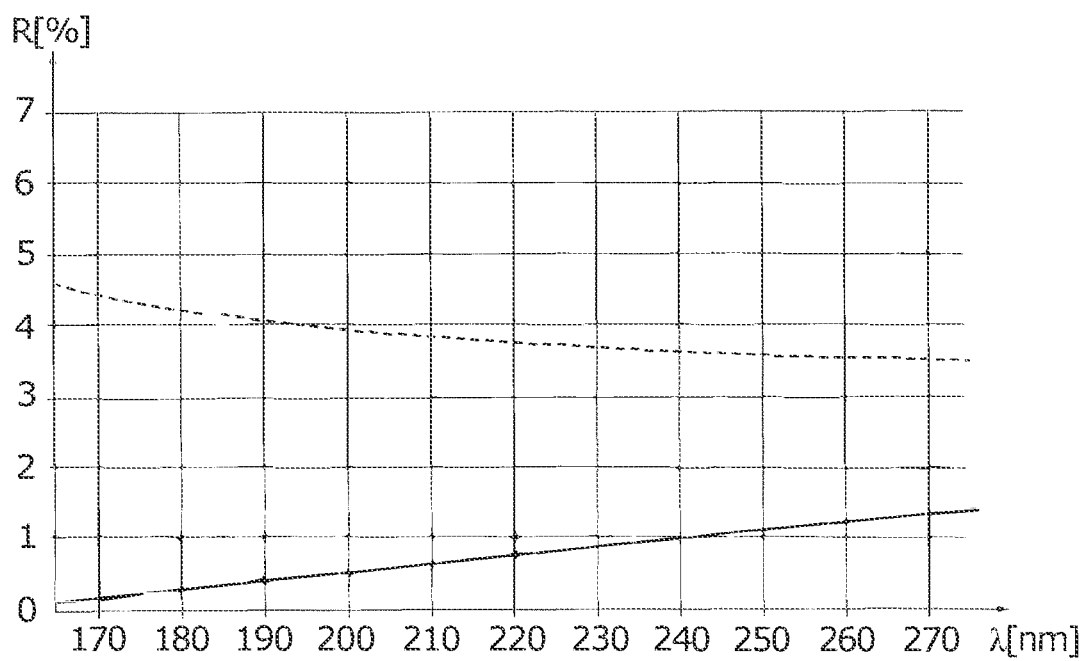
FIG. 2 shows schematic illustrations of the reflectivity of the surface before and after forming the nanostructures as a function of wavelength.

The nanostructures 5 shown in FIG. 1C result in a faceting of the surface 3, which has the effect that the reflectivity R of the surface 3 as illustrated in FIG. 2 decreases. The nanostructures 5 therefore act in the manner of an antireflection coating of the surface 3. The rearrangement of the exposed surface 3 during irradiation is not effected instantaneously, but rather at a rearrangement rate or at a rearrangement speed that is typically all the greater, the smaller the coverage of the surface 3 with adsorbates.

The irradiation of the surface 3 is typically carried out until the reflectivity R of the surface 3 as a result of the nanostructures 5 formed thereon, for a predefined wavelength $\lambda$ or for a predefined wavelength range, for example the FUV/VUV wavelength range between approximately 100 nm and approximately 280 nm, falls below a predefined value. In the case of the reflectivity profile illustrated by a solid line by way of example in FIG. 2 the reflectivity R of the surface 3 on which the nanostructures 5 are formed is less than 0.02 over the entire FUV/VUV wavelength range. For the VUV wavelength range between approximately 100 nm and 230 nm, the reflectivity R is even lower still and is less than approximately 0.01.

As can likewise be discerned in FIG. 2, the irradiation reduces the reflectivity R—illustrated in a dashed manner—of the surface 3 prior to irradiation as illustrated in FIG. 1A in comparison with the reflectivity R of the surface 3 after irradiation as illustrated in FIG. 1C by an absolute value of at least 0.02, specifically over the entire FUV/VUV wavelength range. For the VUV wavelength range, the reduction of the reflectivity R is even greater still, i.e. in this wavelength range the reflectivity R is reduced by an absolute value of approximately 0.035.

In a departure from the process—shown in FIG. 1B—of introducing the energy input E into the surface 3 by irradiation with radiation 4 in the FUV/VUV wavelength range, it is also possible to introduce the energy input E by irradiation with IR radiation at wavelengths of more than approximately 9 µm. In this case, too, it is advantageous if the IR radiation 4 is at wavelengths within a wavelength range in which the material of the substrate 1 has a high absorption, such that the IR radiation 4 has the smallest possible penetration depth into the substrate 1 and the energy input E during irradiation is substantially concentrated on the surface 3.

In the case of $CaF_2$ as material of the substrate 1, which practically completely absorbs radiation 4 at wavelengths of more than approximately 14 µm, it has proved to be advantageous if the irradiation is performed with radiation 4 at wavelengths of more than 9 µm. By way of example, $CO_2$ lasers that emit laser radiation at a wavelength in the range of 9-11 µm can be used for this purpose. Such $CO_2$ lasers first attain a sufficiently high power or intensity, which can be e.g. more than approximately 20 mJ/cm², and secondly, in short-pulse operation (in the case of Q-switching using a Q-switch or an optical modulator), can generate pulse durations of less than 100 ns, which prevents the propagation of heat in the volume of the crystalline substrate 1 in a particularly effective manner.

Irradiation with wavelengths in the IR wavelength range has the advantage that, in contrast to irradiation with wavelengths in the FUV/VUV wavelength range, practically no damage to the substrate 1 occurs as a result of two-photon processes. Instead of an infrared or $CO_2$ laser, it is also possible to use a different type of IR radiation source, for example an infrared lamp, for irradiation purposes. Such a radiation source, just like a $CO_2$ laser, can emit radiation both in continuous wave (cw) operation or in a pulsed manner, the pulsed mode being advantageous owing to the risk of thermal deformation of the optical element.

As an alternative to the introduction of the energy input E or of heat into the surface 3 by irradiation, as shown in FIG. 1B, the energy input E can optionally also be effected by direct heat transfer, i.e. by conduction, or by convection.

As an alternative to producing the nanostructures 5 directly on the surface 3 of the crystalline substrate 1, it is also possible to produce the nanostructures 5 on a surface 7 of a layer 6 which was applied to the surface 3 of the substrate 1 by a coating method, to put it more precisely by vacuum vapor deposition or by epitaxial growth, as is illustrated below in association with FIGS. 3A-C. In the example shown in FIGS. 3A-C, the substrate 1 is $MgF_2$, in the case of which, in contrast to the example shown in FIGS. 1A-C, the (110) lattice plane has the minimum surface energy $\gamma_{110}$. The exposed surface 3 of the $MgF_2$ substrate 1 is the (001) lattice plane, which has the minimum surface energy $\gamma_{001}$ in the case of the substrate 1 consisting of an $MgF_2$ crystal. In the example shown in FIG. 3A, the layer 6 is applied to the surface 3 of the substrate 1 by homoepitaxial growth, i.e. the layer 6 likewise consists of $MgF_2$ and has the same crystal structure as the $MgF_2$ crystal of the substrate 1. Accordingly, the surface 7 of the $MgF_2$ layer 6 also runs along the (001) lattice plane, the surface energy $\gamma_{001}$ of which is greater than that of the (110) lattice plane having the minimum surface energy $\gamma_{110}$.

In the example described in FIGS. 3A-C, too, a rearrangement of the surface 7 of the layer 6 to form nanostructures 5 (cf. FIG. 3C) can therefore be effected by the layer 7 being irradiated with electromagnetic radiation 4, as is illustrated in FIG. 3b. $MgF_2$ also has a comparatively high absorption in the FUV/VUV wavelength range and in the IR wavelength range. Therefore, it is possible to carry out the irradiation with electromagnetic radiation 4, in particular with laser radiation, at the wavelengths described further above in association with FIGS. 1A-C, the irradiation in the IR wavelength range having proved to be advantageous. Moreover, the irradiation of the surface 7 can be effected in a pulsed manner in order to minimize the penetration depth of the radiation 5 into the volume of the substrate 1.

As an alternative to homoepitaxial growth, the layer 6 can also be applied to the surface 3 of the substrate 1 by heteroepitaxial growth, wherein a fluoridic crystal can be used as layer material and/or as a material of the substrate 1. In this case, too, care should be taken to ensure that during the growth of the layer 6 a surface 7 forms which is not oriented along a lattice plane having the minimum surface energy, since in this case it is not possible to rearrange the surface 7 with an energy input E. During heteroepitaxial layer growth, care should be taken to ensure that the lattice defect between the material of the growing layer 6 and the material of the substrate 1 is not excessively large.

FIGS. 4A-C show an example of the formation of nanostructures 5 which involves using the insufficient lattice match between the substrate 1, which is $CaF_2$ in this case, and a heteroepitaxial growing layer 8 in order to form insular nanostructures 5. In the example shown in FIGS. 4A-C, the material of the growing layer 8 is a metal fluoride, to put it more precisely $MgF_2$. Instead of $MgF_2$, it is also possible to use other fluorides or a fluoridic mixed crystal as layer materials. Given suitable process parameters when applying the layer 8, in the system $CaF_2$—$LnF_3$ (Ln denotes an element of the lanthanum group) it is possible to form a mixed crystal having a fluorite crystal structure, as is described in reference [10], which is incorporated by reference in its entirety in the content of this application. As can be gathered from the phase diagrams illustrated therein, comparatively large concentration ranges exist in which mixed crystals having a fluorite crystal structure form in the system $CaF_2$—$LnF_3$.

As is known from [9], a lattice mismatch during heteroepitaxial growth results in 3D island growth. As is illustrated in FIG. 4B, the island growth, i.e. the formation of the insular nanostructures 5, is assisted by introducing an energy input E into the surface 3 or into the growing mixed crystal 8, but this is not absolutely necessary. In the example shown in FIG. 4B, introducing the energy input E is effected by irradiation with radiation 4 in the IR wavelength range, i.e. at wavelengths of more than 1000 nm. By suitably choosing process parameters, the size and the density of the nanostructures 5 produced can be adapted in order to achieve the best possible antireflective effect.

As is illustrated in FIG. 4C, a fluoridic or oxidic protective layer 9, for example, can be applied to the nanostructures 5. In the example illustrated in FIG. 4C, the protective layer 9 was deposited on the surface 3 of the substrate 1 by atomic layer deposition. This is advantageous since the protective layer 9 is applied conformally (atomic layer by atomic layer) and conformal coverage of the nanostructures 5 is thus made possible, as can be discerned in FIG. 4C. The protective layer 9 serves to seal the nanostructures 5 or the surface 3 or to prevent the resistance of the surface 3 during irradiation with powerful radiation. Oxides, for example $Al_2O_3$, $SiO_2$ or fluorinated $SiO_2$, are suitable as material for the protective layer 9. The protective layer 9 shown in FIG. 4C can likewise be applied to the nanostructures 5 shown in FIG. 1C, or to those shown in FIG. 3C.

FIG. 5 shows an optical element 10 in the form of a plane-parallel plate, this optical element having a substrate 1 composed of $CaF_2$. The optical element 10 forms a discharge chamber window of an excimer laser 11, into the resonator section of which a gas mixture, for example containing fluorine, is introduced. As can be discerned in FIG. 5, the nanostructures 5 illustrated—with an exaggerated size—are formed on the inner side and on the outer side of the optical element 10, said outer side being situated outside the housing of the excimer laser 11. The laser radiation 12 of the excimer laser 11 having a wavelength of 157 nm passes through the optical element 12 with the nanostructures 5, which have an antireflective effect for the laser radiation 12. The protective layer 9 described in association with FIG. 4C is applied on the nanostructures 5 formed on the outer side of the optical element 10. The inner side of the optical element 10 is situated in a fluorine-containing atmosphere and is therefore significantly more resistant to radiation, and so no protective layer is required there. Optical elements other than the discharge chamber window shown in FIG. 5, for antireflective coating, can also be provided with nanostructures 5.

REFERENCES

[1] Ute Natura, Stephan Rix, Martin Letz, Lutz Parthier, "Study of haze in 193 nm high dose irradiated $CaF_2$ crystals", Proc. SPIE 7504, Laser-Induced Damage in Optical Materials: 2009, 75041P (2009).

[2] S. Rix, U. Natura, F. Loske, M. Letz, C. Felser, and M. Reichling, "Formation of metallic colloids in $CaF_2$ by intense ultraviolet light", Applied Physics Letters 99 (26) 261909 (2011).

[3] W. H. Southwell, "Pyramid-array surface-relief structures producing antireflection index matching on optical surfaces", Journal of the Optical Society of America A8 (3), 549-553 (1991).

[4] S. J. Wilson and M. C. Hutley, "The optical properties of 'Moth eye' antireflection surfaces", Optica Acta 29 (7) 993-1009 (1982).

[5] S. Chattopadhyay et al., "Anti-reflecting and photonic nanostructures", Materials Science and Engineering R 69, 1-35 (2010).

[6] T. Lohmuller et al., "Biomimetic Interfaces for High-Performance Optics in the Deep-UV Light Range", Nano Letters 8, 1429-1433 (2008).

[7] H. Dabringhaus et al., "Studies of the Facetting of the Polished (100) Face of $CaF_2$", AIP Conference Proceedings 696 (1), 783-790 (2003).

[8] R. I. Eglitis, H. Shi and G. Borstel, "First-principles calculations of the $CaF_2$ (111), (110), and (100) surface electronic and band structure", Surface Review and Letters 13 (2 & 3) 149-154 (2006).

[9] J. E. Prieto, L Markov, "Stranski-Krastanov mechanism of growth and the effect of misfit sign on quantum dots nucleation", Surface Science 664,172-184 (2017).

[10] B. P. Sobolev, P. P. Fedorov, "Phase diagrams of the $CaF_2$— (Y, Ln) $F_3$ systems I. Experimental", Journal of the Less Common Metals 60 (1), 33-46 (1978)

What is claimed is:

1. A method for forming nanostructures on a surface of a crystalline substrate for transmission of radiation in the far-ultraviolet/vacuum-ultraviolet (FUV/VUV) wavelength range, comprising:
   providing a surface, which surface is not oriented along a lattice plane having a minimum surface energy, on the substrate or on a layer formed from a fluoridic crystal applied to the substrate by a coating method, and
   introducing an energy input into the surface for rearranging the surface to form the nanostructures, wherein the energy input is generated by directly irradiating the surface with electromagnetic radiation.

2. The method as claimed in claim 1, wherein the nanostructures are reflection-reducing nanostructures, the surface is a polished surface and the crystalline substrate is ionic.

3. The method as claimed in claim 1, wherein the irradiation of the surface is with electromagnetic radiation introduced in a pulsed manner.

4. The method as claimed in claim 3, wherein the pulsed electromagnetic radiation irradiating the surface has pulse durations of less than 300 ns.

5. The method as claimed in claim 1, wherein the irradiation of the surface is electromagnetic radiation in a Far-Ultraviolet (FUV)/vacuum ultraviolet (VUV) wavelength range.

6. The method as claimed in claim 5, wherein the electromagnetic radiation irradiating the surface is at wavelengths of less than 200 nm.

7. The method as claimed in claim 1, wherein the electromagnetic radiation irradiating the surface is in an infrared (IR) wavelength range.

8. The method as claimed in claim 7, wherein the electromagnetic radiation irradiating the surface is at wavelengths of more than 9 µm.

9. The method as claimed in claim 1, wherein said providing the surface comprises cutting the substrate along a lattice plane which does not correspond to the lattice plane having a minimum surface energy.

10. The method as claimed in claim 1, wherein said introducing of the energy input is carried out until the surface on which the nanostructures are formed has a reflectivity for radiation in the FUV/VUV wavelength range that is reduced by at least 0.03 by comparison with the surface prior to introducing the energy input, and/or has a reflectivity of less than 0.02 for radiation in the FUV/VUV wavelength range.

11. The method as claimed in claim 1, wherein the substrate is formed from a fluoridic crystal.

12. The method as claimed in claim 11, wherein the coating method comprises vacuum vapor deposition, and the fluoridic crystal is selected from the group consisting essentially of: $CaF_2$, $MgF_2$, $BaF_2$, $SrF_2$, $LaF_3$, $YF_3$, LiF.

13. The method as claimed in claim 1, further comprising: applying at least one protective layer to the nanostructures.

14. The method as claimed in claim 13, wherein the at least one protective layer is a conformal, fluoridic or oxidic, protective layer.

15. The method as claimed in claim 13, wherein the protective layer is applied by atomic layer deposition.

16. A method for forming nanostructures on a surface of a crystalline substrate for transmission of radiation in the FUV/VUV wavelength range, comprising:
   forming the nanostructures by three-dimensional island formation on a fluoridic mixed crystal produced by a coating method on the surface of the substrate formed from a metal fluoride.

17. The method as claimed in claim 16, wherein the nanostructures are reflection-reducing nanostructures, the surface is a polished surface and the crystalline substrate is ionic, and
   wherein the coating method comprises vacuum vapor deposition, and
   wherein the metal fluorideis $CaF_2$.

* * * * *

UNITED STATES PATENT AND TRADEMARK OFFICE
CERTIFICATE OF CORRECTION

| | |
|---|---|
| PATENT NO. | : 11,982,788 B2 |
| APPLICATION NO. | : 17/341239 |
| DATED | : May 14, 2024 |
| INVENTOR(S) | : Shklover et al. |

It is certified that error appears in the above-identified patent and that said Letters Patent is hereby corrected as shown below:

On the Title Page

Page 2, Column 2, item (56) under "OTHER PUBLICATIONS," Line 13, delete ""Stranski-Krastanovc" and insert -- "Stranski-Krastanov --.

Page 2, Column 2, item (56) under "OTHER PUBLICATIONS," Line 19, delete "Reciew" and insert -- Review --.

Page 2, Column 2, item (56) under "OTHER PUBLICATIONS," Line 28, delete ""Biomimetric" and insert -- "Biomimetic --.

In the Specification

Column 10, Line 39, delete "3b." and insert -- 3B. --.

Column 12, Line 30, delete "(1978)" and insert -- (1978). --.

In the Claims

Column 14, Line 18, in Claim 17, delete "fluorideis" and insert -- fluoride is --.

Signed and Sealed this
Tenth Day of September, 2024

Katherine Kelly Vidal
*Director of the United States Patent and Trademark Office*